United States Patent [19]
Grilletto et al.

[11] Patent Number: 5,603,892
[45] Date of Patent: Feb. 18, 1997

[54] SYSTEM FOR MAINTAINING A CONTROLLED ATMOSPHERE IN AN ELECTRONIC CIRCUIT PACKAGE

[75] Inventors: Carlo Grilletto, San Carlos; David A. Horine, Los Altos, both of Calif.

[73] Assignee: Fujitsu Limited, Japan

[21] Appl. No.: 257,068

[22] Filed: Jun. 9, 1994

[51] Int. Cl.⁶ .......................... G05B 13/00; G05B 15/00; G05D 16/00; A62B 7/08
[52] U.S. Cl. ...................... 422/3; 422/10; 422/40; 422/111; 422/112; 422/123; 437/7; 437/10
[58] Field of Search ..................... 422/3, 9, 10, 40, 422/110, 111, 112, 116, 123; 228/8, 217, 219; 437/7, 10, 949; 261/682

[56] References Cited

U.S. PATENT DOCUMENTS

| | | | |
|---|---|---|---|
| 3,508,881 | 4/1970 | Hagenauer et al. | 422/40 X |
| 3,915,739 | 10/1975 | Maahs et al. | 134/21 |
| 4,231,508 | 11/1980 | Wagner | 228/219 |
| 4,426,769 | 1/1984 | Grabbe | 437/10 |
| 4,835,114 | 5/1989 | Satou et al. | 437/949 X |
| 4,936,922 | 6/1990 | Cherry | 134/22.18 |
| 4,938,834 | 7/1990 | Yamamoto et al. | 156/382 |
| 4,963,693 | 10/1990 | Kodl | 174/11 R |
| 4,995,552 | 2/1991 | Choi et al. | 228/180.5 |
| 5,000,819 | 3/1991 | Pedder et al. | 156/643 |
| 5,308,382 | 5/1994 | Prasad | 95/12 |
| 5,340,553 | 8/1994 | Huffman | 423/219 |
| 5,364,011 | 11/1994 | Baker et al. | 228/219 X |

*Primary Examiner*—Nina Bhat
*Attorney, Agent, or Firm*—Coudert Brothers

[57] ABSTRACT

A system for maintaining electronic components, such as integrated circuit chips, in a contaminant-free controlled atmosphere is disclosed. The components, which may be mounted on a multichip module, are housed in a sealed enclosure and a positive pressure of contaminant-free gas, such as pure nitrogen, is maintained within the enclosure. A source of pressurized gas, controllably connected to the enclosure is provided and, preferably, an exhaust valve is used to equalize the pressure in the enclosure when it is necessary to access the interior for purposes of maintenance or repair. Preferably, there is a control system which monitors and maintains the proper level of pressure within the enclosure and which may be used to periodically flush the enclosure. Also preferably, one or more canisters of getter material are attached to the enclosure for removing contaminants.

33 Claims, 2 Drawing Sheets

SYSTEM FOR MAINTAINING A CONTROLLED ATMOSPHERE IN AN ELECTRONIC CIRCUIT PACKAGE

FIELD OF THE INVENTION

This invention relates to multichip modules for housing a plurality of integrated circuit chips, and is particularly related to maintaining such modules in a controlled ambient atmosphere to prevent degradation of micro-electronic components.

BACKGROUND OF THE INVENTION

The use of multichip modules for mounting and interconnecting a plurality of integrated circuit ("IC") chips is becoming increasingly important and common as electronic devices continue to shrink in size and operate at higher frequencies. In such modules, chips are mounted on one or more chip-carrying substrates. The substrates are typically multilayered and contain the various signal, power and ground lines needed by the chips to operate. By mounting many chips in a multichip module, it is possible to achieve very high chip densities, thereby minimizing the lengths of the signal paths between chips, and allowing a large number of chips to be contained in a relatively small space. In order to realize these benefits, however, the multilayered substrates that are used have become quite complex. In one common method of construction, such multilayered substrates often include a plurality of dielectric layers of a polyimide material between patterned metal layers.

When constructed, a multichip module may contain many complex and highly integrated active semiconductor devices, and passive devices such as bypass capacitors and resistors, in addition to the necessary electrical contacts, traces and other structures used for supplying power and ground to the devices and for communications among the devices and between the module and the outside. Many of these structures are susceptible to failure when exposed to reactive gaseous contaminants such as water vapor. In this regard, it is noted that the polyimide layers frequently used in multichip modules are apt to adsorb and then outgas water vapor.

One prior art approach to preventing chips and other devices or structures from being exposed to potentially deleterious gases is encapsulation. While this approach may be somewhat useful in conjunction with single-chip packages which generally do not employ multilayered substrates, it is not as useful with complex multichip modules. Unlike single-chip modules, in multichip modules, it is often desirable to be able to repair or replace individual components within the module without replacing the whole module. This is generally quite difficult or impossible if the entire module is encapsulated. Moreover, encapsulation would not prevent water vapor trapped within the encapsulated structure from migrating to sensitive components.

Another approach, used both with single chip and multi-chip modules, is to place the sensitive components in a hermetically sealed chamber which is flushed and filled with a chemically inert gas such as nitrogen or helium. This approach has two problems. First, it is common for such packages to eventually develop leaks due to small cracks or holes, thereby allowing the inert gas to leak out and deleterious gases to leak in. In this regard, it is noted that chip packages may be subject to repeated thermal cycling over a substantial temperature range, which creates substantial mechanical stresses on the seals and leads to the development of cracks. Second, contaminants from the package itself can leak into the sealed chamber and cause damage. For example, water vapor from polyimide layers or other surfaces can outgas into the sealed chamber, where it is then trapped. Thus, moisture may enter into a micro-electronic circuit either from an external leak or by outgassing from the internal components. Outgassing of water vapor is a particularly difficult problem since water, because of its bipolar nature, readily adheres to many surfaces when they are exposed to normal atmospheric conditions where significant moisture is likely to be present. The adsorbed water vapor then slowly outgasses when surfaces are placed within a sealed, moisture-free enclosure.

In some electronic applications, such as in the construction of vacuum tubes, this problem is solved by a "bake-out" of the exposed surfaces to drive off adsorbed gases prior to sealing. However, this approach is not very useful with micro-electronic devices, such as semiconductor chips and the like, which may be destroyed if heated to too high a temperature. While IC chips are typically heated to drive off moisture, the heating temperature is lowers and the duration of heating is generally shorter than that used with less sensitive components such as vacuum tubes. Likewise, elevating a chip module to a temperature sufficiently high to completely drive off contaminant gases may not be practical in connection with repairs that may be required in the field, where the components may be exposed to atmosphere when the package is opened for repair. Finally, even at high temperature, a bake-out of adsorbed gases takes a substantial time, thereby adding to production costs, or, if done in the field, adding to delay in getting the system back "on-line."

Accordingly, there is a need for an improved apparatuses and methods for packaging micro-electronic components in a multichip module whereby said components are protected from the deleterious effects of reactive gases.

SUMMARY OF THE INVENTION

Therefore, an object of the present invention is to provide a multichip module wherein sensitive micro-electronic components are housed and maintained within a controlled inert atmosphere.

Another object of the present invention is to provide means for maintaining a non-reactive atmosphere around sensitive electronic components in an electronic package, whereby the controlled atmosphere is maintained despite any leaks or outgassing of contaminants.

Yet another object of the present invention is to provide means for purging an enclosed container housing sensitive electronic components with non-reactive or selectively reactive gas whereby outgassing problems are mitigated.

These and other objects of the present invention that will become apparent to those of ordinary skill in the art upon reading this specification in conjunction with the figures and the appended claims are realized in the novel apparatus and method for maintaining a controlled atmosphere of a desired gas in a chamber housing sensitive micro-electronic components such as integrated circuit chips. In an apparatus in accordance with the present invention, micro-electronic components, such as integrated circuit chips and the like, are contained within an enclosed, preferably hermetically sealed, chamber which is in fluid communication with a source of pressurized gas. Means are provided for flushing the chamber and for supplying said gas such that a positive pressure is maintained within the chamber. Preferably, pressure in the chamber is monitored by a control system using pressure sensing means, which controls the flow of gas into and out of the chamber during flushing, while maintaining a desired positive pressure. Preferably, the gas is chemically inert in respect to the materials and components within the sealed chamber, and may consist of nitrogen or a noble gas such as helium or argon. The atmosphere that is maintained within the chamber may also consist of a mixture of inert gases, or may comprise a gas which does not affect the components within the enclosure but which will react with the potential contaminants, e.g., water vapor. The system may also have a controllable gas release means to allow the chamber to be purged and to depressurize the chamber when access to the chamber is desired, for example, to replace or repair a component within the chamber. In a particularly preferred embodiment, one or more getters are attached to the chamber such that any deleterious materials that outgas from the surfaces and components within the chamber, or otherwise enter the chamber, are captured before they can cause damage. Such embodiment may include means for periodically renewing the getter by backflushing. In yet a further aspect, the present invention may include sensors, operably coupled to a control system for monitoring the enclosure, and may include a heater for accelerating the outgassing of contaminants when the container is sealed.

A method in accordance with a broad aspect of the present invention comprises the steps of enclosing electronic components within a chamber, coupling the chamber to a source of gas, flushing the chamber, and automatically maintaining a substantially constant predetermined positive pressure of said gas within said chamber. In a further aspect, gas can be flushed through the chamber at predetermined intervals or in response to a sensor to purge any contaminants that become trapped therein. In a further embodiment, the gas within the chamber is gettered.

DETAILED DESCRIPTION

Figure 1:
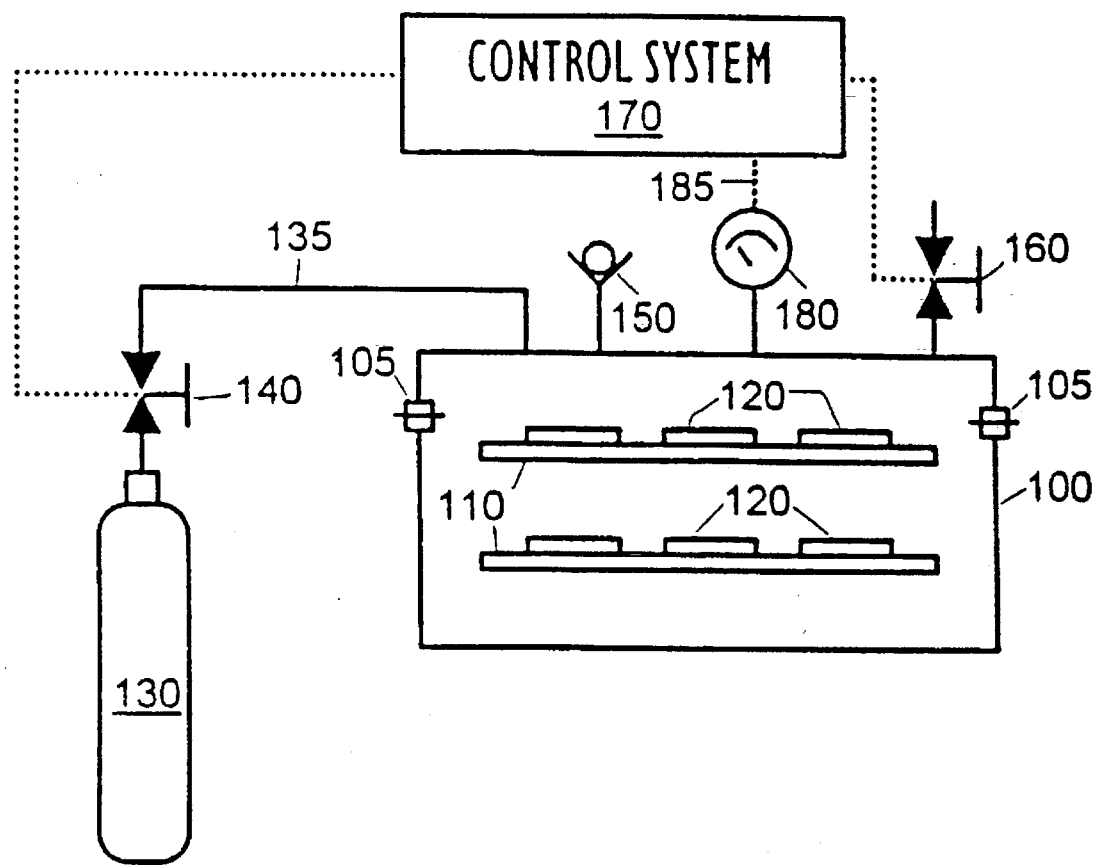
FIG. 1 is a schematic, cross-sectional view of an enclosed chip module of the present invention.

A system for maintaining micro-electronic components susceptible to damage by deleterious gases, such as water vapor, is shown in FIG. 1, to which we now turn. According to the present invention, the components, for example, bare IC chips in a multichip module, are housed in a sealed enclosure, or chamber 100, within which is maintained an atmosphere of an inert gas. For exemplary purposes, a multichip module comprising two substrates 110, each carrying a plurality of IC chips 120, is shown positioned within enclosure 100. As will be recognized by those skilled in the art, various other active or passive electronic components may be included within enclosure 100, as well as power and signal lines for interconnecting the substrates 110 within the enclosure to each other and with external devices. As described above, substrates 110 may be multilayered with power, ground and signal lines embedded therein. A typical multilayered structure, however, uses dielectric layers formed of polyimide, which readily adsorbs water vapor when exposed to the atmosphere and thereafter outgasses. The details of how to construct and interconnect multichip modules and other micro-electronic components housed within enclosure 100 are well known to those skilled in the art and will not be described in greater detail.

Although enclosure 100 is schematically depicted as a box, those skilled in the art will recognize that in practice other shapes will generally be preferred. In particular, it will generally be preferable to minimize the volume of the enclosure and to conform the shape of the enclosure to match the components housed within it. In addition, in the preferred embodiment of the present invention, enclosure 100 is reversibly sealable so that it may be repeatedly opened and closed. This allows access to the components housed within the enclosure for purposes of repair, replacement and/or testing of the components. Various means are known for forming a reversible seal for an enclosure. For example, a combination of flanges and gaskets or O-ring seals may be used. Such a reversible seal is schematically depicted in FIG. 1 at 105. The details of how to construct an appropriate reversibly sealed enclosure are well known.

A source of pressurized gas 130 is in fluid communication with the interior of enclosure 100 via gas line 135 and valve 140. Preferably, the gas used in conjunction with the present invention is an inert gas such as nitrogen or helium. Any of the noble gases may be used since they are, effectively, completely chemically inert. However, for purposes of the present disclosure, the term "inert" is intended to be relative to the components and materials housed within enclosure 100. Thus, nitrogen, which is chemically active in relation to certain materials and under certain conditions, is considered inert for purposes of the present specification because it does not have deleterious reactions with the materials typically used in micro-electronic components under the conditions present within the enclosure. A gas having selected reactive properties with potential contaminants may be used. For example, if a particular compound of concern is known to outgas from the surfaces within enclosure 100, a gas which reacts with and neutralizes the compound of concern may be selected to act, essentially, as a getter. Such a selectively reactive gas is inert with respect to the micro-electronic components within chamber 100.

Valve 140, which may be opened and closed by control system 170, activates the flow of gas from container 130 to enclosure 100. Pressure release valve 150 is also connected to enclosure 100 to ensure that the pressure within the enclosure does not rise above a predetermined level. A simple valve comprising a spring-loaded ball which sealably mates with a valve seat may be used. In such a valve, when the pressure exceeds the force of the spring, the ball becomes unseated and the valve opens. Other similar valves which open at a predetermined pressure level may also be used.

Exhaust valve 160, which also may be opened and closed by control system 170, is used to controllably allow gas to leave the enclosure. The operation of these components is described below. Finally, pressure gauge 180 measures the total gas pressure within enclosure 100. In a preferred embodiment, the pressure reading is communicated via signal line 185 to control system 170.

Although control system 170 is depicted as being separate from the multichip module, if the module comprises a computer or microprocessor with the necessary I/O devices, system control can be accomplished by such computer. Of course, a separate control system can be used if necessary. Such a system will typically comprise a microcontroller, I/O devices, and means, such as a read-only memory, for containing the necessary programming described herein. The details of how to construct and program a control system with the capabilities described herein are well known to those skilled in the art.

In operation, after the micro-electronic components to be housed in enclosure 100 are properly positioned within the enclosure, the enclosure is sealed. For reasons that will become apparent, although it is preferable that the seal be airtight or hermetic, one of the advantages of the present invention is that a perfect seal is not required and a certain amount of leakage can be tolerated. Upon sealing the enclosure, control system 170 is activated and begins a startup routine. Control system 170 determines from pressure gauge 180 that the pressure within enclosure 100 is substantially atmospheric pressure. At this point, control system 170 activates gas supply valve 140 so that gas from source 130 flows into the enclosure. As will be apparent to those skilled in the art, a pressure reducer and/or a flow controller will also be connected between gas container 130, which is highly pressurized, and enclosure 100. The flow controller/pressure reducer may be built into valve 140.

In one embodiment, as part of the startup routine, pressure release valve 160 is also opened and, as a consequence, atmospheric gases initially contained in enclosure 100 when it is sealed are flushed out of the system as gas flows through the enclosure. After flushing the enclosure for a predetermined period of time, or using a metered quantity of gas, valve 160 is closed and the pressure within the enclosure builds up. When the pressure within the enclosure has reached a predetermined level, as read by pressure gauge 180, valve 140 is closed. The predetermined pressure level is, preferably, only slightly above atmospheric pressure, so that the pressure does not cause excessive mechanical forces on the walls or seals comprising the enclosure. In one embodiment, a pressure of one pound per square inch (1 psi) above atmospheric pressure is used. A positive pressure is required, however, in order that gas will flow out of chamber 100 if a leak were to develop.

In an alternative embodiment, exhaust valve 160 remains closed throughout the startup routine and any subsequent flushing of the enclosure. In this embodiment, upon startup, the enclosure is sealed and valve 140 is opened to allow gas to flow into enclosure 100 from gas container 130. When gas within the enclosure builds up to the relief pressure of pressure release valve 150, valve 150 is forced open. Thereafter, valve 140 is left open, allowing gas to continue to flow into the enclosure and out through pressure release valve 150, flushing the enclosure of any atmospheric gases. When flushing of the enclosure is complete, valve 140 is closed and pressure in the enclosure stabilizes at the relief pressure of pressure release valve 150. Thus, in this embodiment, the relief pressure of valve 150 is selected to be the desired pressure of the operating enclosure.

After the pressure within enclosure 100 is stabilized at the desired level, there is, preferably, no gas flow into or out of enclosure, such that the atmosphere within the enclosure remains inert. However, the pressure is monitored and, in the event that gas leaks out of the enclosure, control system 170 automatically opens valve 140 to replenish the supply of inert gas. In addition, if a significant leak is detected, control system 170 can send an error message to the operator or signal an alarm. Alternatively, control system 170 may be programmed such that an error message or alarm is only triggered when the leak is significant such that, for example, the desired pressure cannot be maintained.

It is noted that in operation multichip module 110 becomes heated, thereby causing the gas in the enclosure to become heated. This causes the gas pressure to increase which, in turn, may cause the loss of gas out of pressure relief valve 140. If gas is lost, when the system later cools, the pressure in the enclosure will be below the desired pressure level. This loss of pressure is sensed by pressure gauge 180, and control system 170 opens valve 140 to bring the pressure back up to the desired level.

In accordance with another aspect of the present invention, the gas within enclosure 100 is flushed at predetermined intervals by opening valve 140, allowing fresh gas from gas source 130 into the enclosure. (In one embodiment, valve 160 may also be opened for this purpose.) After the gas has been flushed, valve 140 is closed and the overpressure of gas is maintained as described above. In the preferred embodiment, the volume of gas that is flushed through the enclosure is at least ten times the volume of the enclosure to ensure that substantially all of the contaminants that are present are flushed out.

Periodic flushing of the enclosure is useful to eliminate contaminants which slowly outgas from the surfaces of the enclosure and are, thus, not fully eliminated with the initial flushing. Alternatively, the flushing may be performed at predetermined intervals which are not periodic. As will be appreciated by those skilled in the art, the rate of outgassing approximates an inverse exponential curve, such that the rate of outgassing is greatest immediately after the enclosure is sealed and asymptotically approaches zero over time. Accordingly, control system 170 may be programmed to perform the flushing process just described to approximate such a curve, i.e., the program is set such that automatic flushing occurs frequently following the startup routine, with the frequency diminishing over time.

Alternatively, one or more sensors, coupled to control system 170, may be positioned within enclosure 100 to monitor the level of contaminant(s) of concern and the control system is programmed to initiate a flushing of the enclosure when a threshold level of a contaminant is detected.

In another embodiment, valve 140 can be left continuously open to allow a small flow of gas to the enclosure such that the enclosure is continuously being flushed. The flow rate is then controlled by a flow controller which can be adjusted, as necessary by control system 170, in the event that a leak develops. This approach is more costly due to higher gas usage and the need for a more expensive precision flow controller. However, it may be preferred where the components within enclosure 100 are extremely sensitive to contamination.

In the event access to the interior of enclosure 100 is required, for example, for the replacement or repair of components, the operator signals or activates control system 170, which then opens valve 160 so that the pressure within the enclosure is equalized before the seal is broken. Pressure equalization is desirable to prevent parts within the enclosure from being subjected to the sudden mechanical forces that would occur if the pressure were suddenly released. Of course, valve 160 may also be manually operable for this purpose.

The enclosure and the system for supplying inert gas to the enclosure are preferably configured such that when the chamber is opened for maintenance (e.g., testing, repair or replacement), inert gas flows across the sensitive microelectronic components to further minimize their exposure to contaminant gases.

Figure 2:
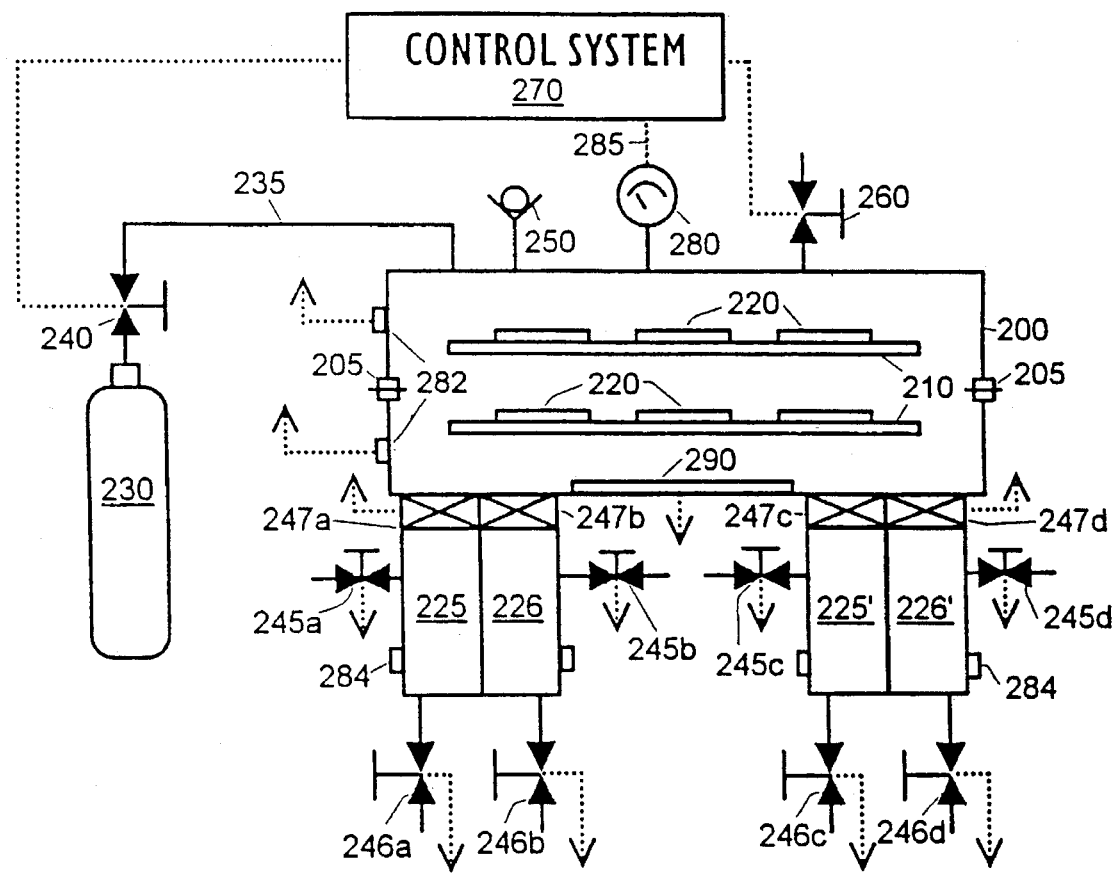
FIG. 2 is a schematic, cross-sectional view of another embodiment of an enclosed chip module of the present invention.

Turning now to FIG. 2, a particularly preferred embodiment of the present invention having additional features is shown. In FIG. 2 those elements that are the same as the elements that have been described in respect to FIG. 1 are given similar numbers using the leading numeral 2 instead of 1. In FIG. 2 a large number of the elements of the system are controlled by control system 270. For clarity, not all of the control lines are fully shown; instead, the connections between many of the elements and the control system is represented by the use of dotted lines with an arrow on one end thereof.

In the embodiment of FIG. 2 a getter is in fluid communication with the multichip module enclosure 200 to remove contaminants that outgas into the enclosure. As depicted in FIG. 2, the getter is, preferably, attached in the form of a canister filled with getter material. In the embodiment shown, two substantially identical canisters of two different types are used. Thus, canisters 225 and 225' contain a water vapor getter, and canisters 226 and 226' contain an oxygen getter. Appropriate getter materials for this purpose are known to those skilled in the art and need not be described in further detail. Thus, while an oxygen getter is described for exemplary purposes, those skilled in the art will recognize that other getter materials are available and may be used to control specific contaminants of concern.

In the embodiment of FIG. 2, a heater 190, coupled to control system 270, is used to promote outgassing of contaminants from the surfaces within enclosure 200. After the system is first sealed and is being flushed as described above, heater 290 is activated to raise the temperature of the surfaces within enclosure 200. Preferably, heater 290 is turned off and the temperature allowed to return to ambient before valve 260 is closed. As noted above, the temperature of the components within enclosure 200 must be kept below a potentially harmful level. Accordingly, the use of the heater alone is insufficient to fully eliminate contaminants, such as water vapor, in a reasonable amount of time. However, as is also described above, the rate of outgassing follows a curve which approximates an inverse exponential, and heating the enclosure when it is first sealed accelerates outgassing when the rate is naturally highest, thereby substantially reducing the load which must otherwise later be absorbed by the getter material.

While heater 290 is shown in FIG. 2 as being mounted within enclosure 200, those skilled in the art will recognize that the heater may also conveniently be placed on an outside surface of the enclosure. In such case, the heater is preferably positioned on a surface which is highly thermally conductive, so that thermal energy is efficiently transferred to the interior surfaces of the enclosure.

Isolation valves 247a–247d are used to open and close the fluid connection between the interior of enclosure 200 and the interior of the canisters 225, 226. Valves 245a–245d, and 246a–246d are also in fluid communication with the canisters and are used as described below. During normal operation of the enclosed multichip module system, valves 247a–247d are opened and valves 245a–245d and 246a–246d are closed. In this configuration, all four exemplary canisters of getter material are simultaneously in fluid communication with the enclosure and contaminants that are introduced into the enclosure by outgassing, or otherwise, are absorbed by the getter material in all the canisters. In another embodiment, one set of canisters, e.g., canisters 225 and 226, are in fluid communication with the enclosure, and the other pair of canisters, e.g., 225' and 226' are held in reserve. This is accomplished by opening valves 247a and 247b while closing valves 247c and 247d.

Over time, as the system of the present invention is operated, the getter material within the canisters loses its efficiency as it absorbs contaminants. If left alone, eventually the getter material would become saturated and completely lose its ability to absorb contaminants. To control this, the canisters may be periodically replaced or flushed and thereby renewed. For example, to flush canister 225, valve 247a is closed to isolate the canister and a purging gas is introduced by opening valve 245a, which is connected to a source of a purging gas (not shown). After flowing through canister 225, the purging gas exits through opened valve 246a. If canister 225' has been held in reserve, as described above, valve 247c may be opened while canister 225 is being flushed. A canister being flushed in this manner may simultaneously be heated to accelerate the canister renewal process. Alternatively, a spent canister can be removed after isolation and replaced. The removed canister can then be renewed after it has been detached.

In the embodiment of FIG. 2, sensors 282 are positioned within the enclosure to detect the presence of contaminants. In the exemplary embodiment shown, there are two such sensors, one of which is for detecting the presence of water vapor and the other for detecting the presence of oxygen. The sensors are linked to control system 270, which, preferably, responds to the presence of contaminants above a background level by causing the system to be flushed as described above in connection with FIG. 1. In addition, the operator is alerted via an error message or alarm. It will be apparent to those skilled in the art that control system 270 can also be programmed to cause one or more of the canisters to be automatically isolated and backflushed. Similarly, the control program can be set to automatically initiate the canister renewal process at predetermined time intervals. In addition, the canisters themselves may also have sensors mounted therein, as shown at 284, to monitor their efficiency.

The continuous gettering of the FIG. 2 embodiment is advantageous over a system which merely flushes the enclosure in response to a contaminant sensor. Critical components within the package may have a high affinity for the contaminants, essentially acting as a contaminant collector or getter. Thus, the presence of these components within the package can interfere with the ability of the sensor to detect a threshold value of contaminant. On the other hand, use of a properly chosen getter within the package will successfully compete with other internal package surfaces. In addition, it can be difficult to accurately sense contaminant levels in a very small package. On the other hand, it is relatively easier to determine the moisture content of the getter material.

While the present invention has been described in connection with several preferred embodiments thereof, those skilled in the art will recognize that other changes and embodiments may be made without departing from the spirit thereof. Accordingly, the scope of the present invention should be construed only with reference to the following claims.

What is claimed is:

1. A method for maintaining micro-electronic components in a controlled atmosphere, comprising the steps of:

enclosing micro-electronic components in a substantially sealed housing;

coupling said housing to a source of inert gas;

flushing said housing with said inert gas, wherein substantially all of the contaminant gases within said housing when it is enclosed are exhausted from said housing;

automatically maintaining a predetermined positive pressure of said inert gas within said housing; and placing a getter material in fluid communication with said enclosed housing wherein contaminant gases within said housing are eliminated from said housing by said getter material.

2. The method of claim 1, wherein the step of automatically maintaining a predetermined positive pressure within said housing comprises the step of sensing the pressure within the housing.

3. The method of claim 1 further comprising the step of exhausting said positive pressure from said housing and, thereafter, opening the housing, wherein said micro-electronic components may be maintained, repaired or replaced.

4. The method of claim 3 further comprising the step of flowing said inert gas across said micro-electronic components while said housing is open.

5. The method of claim 1 further comprising the steps of monitoring the housing for the presence of contaminants and flushing the housing with said inert gas when contaminants are detected.

6. The method of claim 1 further comprising the step of flushing said housing with said inert gas at predetermined intervals.

7. The method of claim 6 wherein said predetermined intervals are periodic.

8. The method of claim 6 wherein said predetermined intervals approximately correspond to an inverse exponential curve.

9. The method of claim 1 wherein the step of flushing said housing comprises the step of flowing a predetermined volume of gas through said housing.

10. The method of claim 1 further comprising the step of heating the surfaces within said housing while said housing is being flushed.

11. The method of claim 1 wherein said getter material is held in a separate container that can be isolated from said housing, and further comprising the step of isolating said container from said housing.

12. The method of claim 11 further comprising the step of backflushing said container of getter material.

13. The method of claim 1 wherein said housing is substantially continuously flushed with said inert gas.

14. A system for maintaining electronic microelectronic components susceptible to damage by contaminant gases in a controlled atmosphere free of said contaminant gases, comprising:

an enclosed, substantially sealed chamber for housing micro-electronic components;

a source of pressurized gas in fluid communication with said chamber;

gas flow control means for flushing said chamber with said pressurized gas;

pressure control means for maintaining a substantially constant positive pressure of said gas within said chamber; and getter means, in fluid communication with said chamber, for eliminating contaminant gases from said chamber.

15. The system of claim 14 further comprising automatic system control means for regulating said gas flow control means operably coupled to said gas flow control means, and further comprising pressure sensing means operably coupled to said system control means for determining the gas pressure within said chamber.

16. The system of claim 15 further comprising an exhaust valve for releasing gas from within said chamber, wherein when said exhaust valve is opened the positive pressure within said chamber is equalized to atmospheric pressure.

17. The system of claim 16 wherein said exhaust valve is operably coupled to said system control means.

18. The system of claim 15 further comprising sensor means for detecting the presence of a contaminant gas within said chamber.

19. The system of claim 18 wherein said control system flushes said chamber when contaminants above a predetermined threshold level are sensed within said chamber.

20. The system of claim 15 wherein said control system flushes the chamber at predetermined intervals.

21. The system of claim 14 wherein said gas is inert with respect to the microelectronic components.

22. The system of claim 14 wherein said gas comprises a reactive material which eliminates contaminants from said chamber.

23. The system of claim 14 wherein said positive pressure within said chamber is maintained at approximately 1 psi above atmospheric pressure during normal operation.

24. The system of claim 14 further comprising reversible sealing means for hermetically isolating said chamber.

25. The system of claim 14 wherein said gas flow control means provides a continuous flow of gas from said source of pressurized gas to said chamber.

26. The system of claim 14 further comprising multiple getter means, wherein more than one type of contaminant gas is eliminated from the system by said multiple getter means.

27. The system of claim 14 further comprising means for isolating said getter means from said chamber while said chamber is in operation.

28. The system of claim 27 wherein at least one of said getter means is housed in a container which is removably attached to said chamber.

29. The system of claim 27 further comprising means for backflushing said getter means.

30. The system of claim 29 wherein said means for isolating said getter means and said means for backflushing said getter means are operably coupled to an automatic control system.

31. The system of claim 14 further Comprising heater means, in thermal communication with the interior of said chamber, for raising the temperature of the surfaces within said chamber, wherein contaminant gases adsorbed on said surfaces are driven off.

32. A system for maintaining a plurality of integrated circuit chips mounted in a multichip module in a controlled atmosphere, said multichip module comprising at least one polyimide layer, said system comprising:

a reversibly sealable enclosure for housing said multichip module;

a source of an inert gas in fluid communication with said enclosure;

flow control means for controlling the flow of said inert gas into said enclosure;

exhaust means for releasing gas from within said enclosure;

system control means coupled to said enclosure, to said flow control means, and to said exhaust means, for automatically controlling said flow control means and said exhaust means, said system control means being adapted to substantially maintain a predetermined positive pressure within said enclosure; and getter means coupled to said enclosure for gettering contaminant gases.

33. The system of claim 32, further comprising a pressure gauge coupled to said system control means for measuring the pressure within said enclosure, and wherein said system control means further comprises signalling means for alerting a user when said pressure in said chamber decreases below a predetermined level.

* * * * *